United States Patent
Sivaramakrishnan et al.

(10) Patent No.: US 7,055,809 B2
(45) Date of Patent: *Jun. 6, 2006

(54) VAPORIZING REACTANT LIQUIDS FOR CHEMICAL VAPOR DEPOSITION FILM PROCESSING

(75) Inventors: Visweswaren Sivaramakrishnan, Cupertino, CA (US); John M. White, Hayward, CA (US)

(73) Assignee: Applied Materials, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/817,396

(22) Filed: Apr. 2, 2004

(65) Prior Publication Data

US 2004/0188866 A1    Sep. 30, 2004

Related U.S. Application Data

(60) Division of application No. 09/919,633, filed on Jul. 31, 2001, now Pat. No. 6,783,118, which is a continuation of application No. 09/660,208, filed on Sep. 12, 2000, now abandoned, which is a division of application No. 08/574,999, filed on Dec. 19, 1995, now Pat. No. 6,224,681, which is a continuation of application No. 08/278,984, filed on Jul. 22, 1994, now abandoned, which is a continuation of application No. 07/990,755, filed on Dec. 15, 1992, now abandoned.

(51) Int. Cl.
   *B01F 3/04*       (2006.01)
(52) U.S. Cl. .................... 261/62; 261/66; 261/DIG. 65; 118/726
(58) Field of Classification Search ................... 261/62, 261/66, DIG. 65; 118/726
See application file for complete search history.

(56) References Cited

U.S. PATENT DOCUMENTS

| 3,930,908 A | 1/1976 | Jolly |
| 4,232,063 A | 11/1980 | Rosler et al. |
| 4,496,609 A | 1/1985 | McNeilly et al. |
| 4,579,080 A | 4/1986 | Martin et al. |
| 4,668,365 A | 5/1987 | Foster et al. |
| 4,761,269 A | 8/1988 | Conger et al. |
| 5,000,113 A | 3/1991 | Wang et al. |
| 5,035,200 A | 7/1991 | Moriyama et al. |
| 5,203,925 A | 4/1993 | Shibuya et al. |
| 5,204,314 A | 4/1993 | Kirlin et al. |
| 5,419,924 A | 5/1995 | Nagashima et al. |
| 6,224,681 B1 | 5/2001 | Sivaramakrishnan et al. |
| 6,783,118 B1 * | 8/2004 | Sivaramakrishnan et al. . 261/62 |

FOREIGN PATENT DOCUMENTS

| EP | 0058571 | 8/1982 |
| EP | 0434966 | 7/1991 |
| EP | 0435088 | 7/1991 |
| EP | 0453107 | 10/1991 |
| EP | 0498622 | 8/1992 |
| EP | 0533201 | 3/1993 |
| JP | 58-125633 | 7/1983 |

* cited by examiner

*Primary Examiner*—Scott Bushey
(74) *Attorney, Agent, or Firm*—Dergosits & Noah

(57) ABSTRACT

The disclosure relates to a vaporizer valve which accepts a carrier gas and a pressurized liquid and forms a mixture of the carrier gas and vaporized liquid. An internal cavity receives the carrier gas through a carrier aperture and the liquid through a liquid aperture, and the mixed gas and vapor are exhausted out of the cavity via a third aperture. A moveable diaphragm disposed adjacent to the liquid aperture forms a vaporization region having a pressure gradient. The liquid passing through this pressure gradient vaporizes due to expansion. By controlling the diaphragm position with a feedback control circuit responsive to a liquid flow rate monitor, the liquid flow rate may be controlled independently of the carrier gas flow rate.

3 Claims, 5 Drawing Sheets

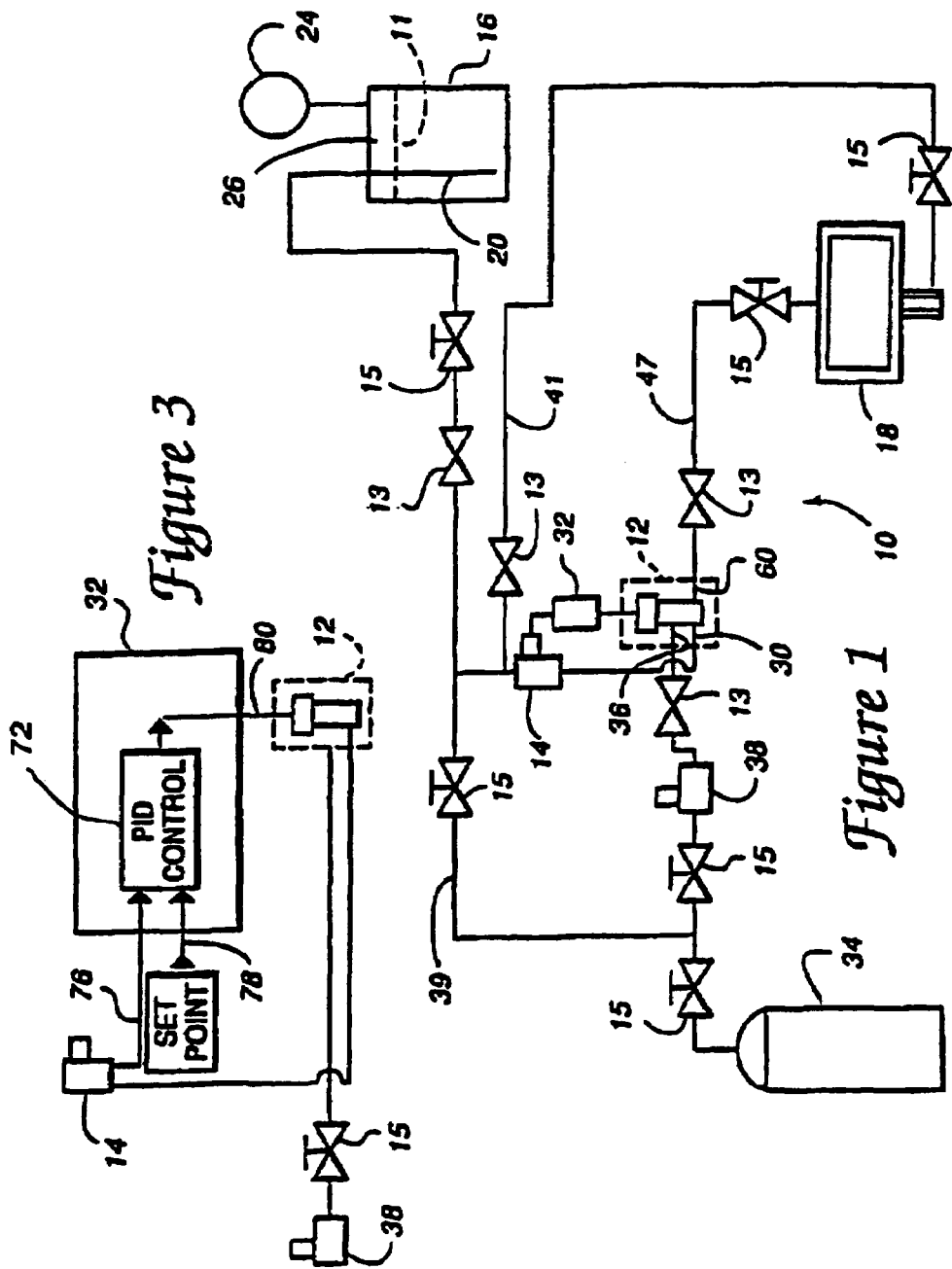

VAPORIZING REACTANT LIQUIDS FOR CHEMICAL VAPOR DEPOSITION FILM PROCESSING

CROSS REFERENCE TO RELATED APPLICATIONS

This application is a divisional of U.S. patent application Ser. No. 09/919,633, filed on Jul. 31, 2001, now U.S. Pat. No. 6,783,118, which is a continuation of U.S. patent application Ser. No. 09/660,208, filed on Sep. 12, 2000, now abandoned, which is a divisional of U.S. patent application Ser. No. 08/574,999, filed Dec. 19, 1995, now U.S. Pat. No. 6,224,681, which is a File Wrapper Continuation of application Ser. No. 08/278,984, filed Jul. 22, 1994, now abandoned, which is a File Wrapper Continuation of original application Ser. No. 07/990,755, filed Dec. 15, 1992, now abandoned, which are all incorporated by reference. This application is related to previously-filed U.S. patent application Ser. No. 07/912,024, filed Jul. 9, 1992, (now U.S. Pat. No. 5,419,924), which is a continuation of Ser. No. 07/626,274, now abandoned.

BACKGROUND OF THE INVENTION

The present invention relates generally to a device for vaporizing a liquid at a controlled rate. More specifically, it relates to a device for vaporizing a liquid with a rapid pressure drop and mixing the vaporized liquid with a carrier gas in a manner which allows independent control of the flow rates of the liquid and carrier gas. The invention is particularly suited for supplying vaporized reactants to the reaction chamber of a chemical vapor deposition system.

Chemical vapor deposition (CVD) processes are widely used in the deposition of thin films used in semiconductor devices and integrated circuits. Such processes involve deposition resulting from a reaction of chemical vapors homogeneously or heterogeneously on a substrate. The reaction rate is controlled, e.g., by temperature, pressure and reactant gas flow rates. The use of low vapor pressure liquids as precursors for such processes has several advantages and has become more common.

Prior CVD processes involve transport of low vapor pressure liquid using a bubbler or boiler. In these processes, a carrier gas saturates the liquid and transports the vapor. The amount of vapor transported depends on the downstream pressure, carrier gas flow, vapor pressure in the ampoule holding the source liquid source, and the like. Thus, the amount of vapor transported is not an independent parameter and therefore is difficult to control. As a result, CVD processes using a bubbler or boiler have not demonstrated the ability to consistently control the flow rate of the vaporized reactant, which decreases the quality of films produced by these processes.

An additional shortcoming of CVD processes using bubblers is that these processes have difficulty producing the high reactant flow rate needed to achieve a high film deposition rate. With a bubbler, increasing reactant flow rate requires either increasing the bubbler temperature or the carrier gas flow rate. However, the reliability of downstream hardware limits the use of a bubbler temperature above a certain value, and the adverse effect of excessive carrier gas flow rate on the quality of the deposited film limits the use of high carrier gas flow rates, thus limiting the amount of vapor that can be transported. Thus, the amount of reactant vapor that can be transported is undesirably limited.

In known boilers, the liquid is heated, and the vapor formed is controlled using a high temperature gas flow controller. In this arrangement, the amount of vapor transported depends on the downstream chamber pressure and the boiler temperature. However, the vapor pressure of liquids commonly used in the deposition of semiconductor films (e.g., tetraethylorthosilane TEOS) is very small at normal operating temperatures; as a result, vapor transport limitations occur when a boiler is used in high pressure (e.g., atmospheric pressure) CVD processes. Heating the boiler to the liquid boiling temperature could obviously improve the vapor transport for such processes, but the boiler temperature is limited by the reliability of the downstream hardware.

The above-referenced previously filed U.S. patent application describes a CVD process in which vapor is formed by flowing heated carrier gas over a bead of liquid. The liquid evaporates into the carrier gas, creating reactant vapor for CVD. The evaporation rate is controlled by adjusting the flow rate of liquid into the bead; at high flow rates, the size and surface area of the bead increases until the evaporation rate equals the liquid flow rate. However, above a given limit, increases in liquid flow rate will result in only partial vaporization. An advantage of this process over the bubbler and boiler techniques is that it allows independent control of the liquid flow rate. However, like the bubbler and boiler techniques, this technique relies on heated evaporation to vaporize the liquid, and thus can produce only limited vaporization rates.

A need therefore remains for a reliable and low maintenance liquid vaporizer which can vaporize liquid at high flow rates and additionally allow independent control of liquid and carrier gas flow rates. The present invention addresses that need.

SUMMARY OF THE INVENTION

The invention features a vaporizer which accepts a carrier gas and a pressurized liquid. An internal cavity receives the carrier gas through a carrier aperture and combines the carrier gas with vapor formed from liquid received through a liquid aperture. The mixed gas and vapor are exhausted out of the cavity via a third aperture. The liquid is vaporized by the pressure differential between the liquid and vapor: a closure element which is substantially wider than the liquid aperture is disposed adjacent to the liquid aperture so that a pressure gradient forms between the liquid aperture and the remainder of the cavity. The liquid passing through this pressure gradient vaporizes due to expansion.

An advantage of the invention is that the vaporizer forms vapor by expansion in a pressure gradient, rather than evaporation by heating, and therefore can vaporize liquid at high flow rate such as those needed for some semiconductor fabrication processes.

In preferred embodiments, the closure element is a diaphragm movable relative to the liquid aperture to increase or decrease the flow rate of the liquid. The closure element is moved by an electrically controlled actuator such as a piezoelectric element. To control the flow rate of the liquid, a liquid flow meter is connected to measure the flow rate of liquid into the liquid inlet port. A feedback control system compares the measured flow rate to a selected value and controls the piezoelectric actuator so that the flow rate approximates the selected values.

An advantage of this embodiment is that the liquid flow rate is controlled solely by the movement of the diaphragm, so that (unlike the vaporization systems described above) the liquid flow rate is independent of the carrier gas flow rate and therefore can be more accurately controlled.

In further preferred embodiments, a heater heats at least a portion of the valve body near the cavity so as to inhibit the liquid, which has cooled due to expansion, from condensing on the walls of the cavity after it has vaporized.

BRIEF DESCRIPTION OF THE DRAWING

FIG. 1 is a block diagram of a liquid delivery system in accordance with the invention.

FIG. 3 is a more detailed block diagram of a portion of the liquid delivery system of FIG. 1.

Figure 2A:
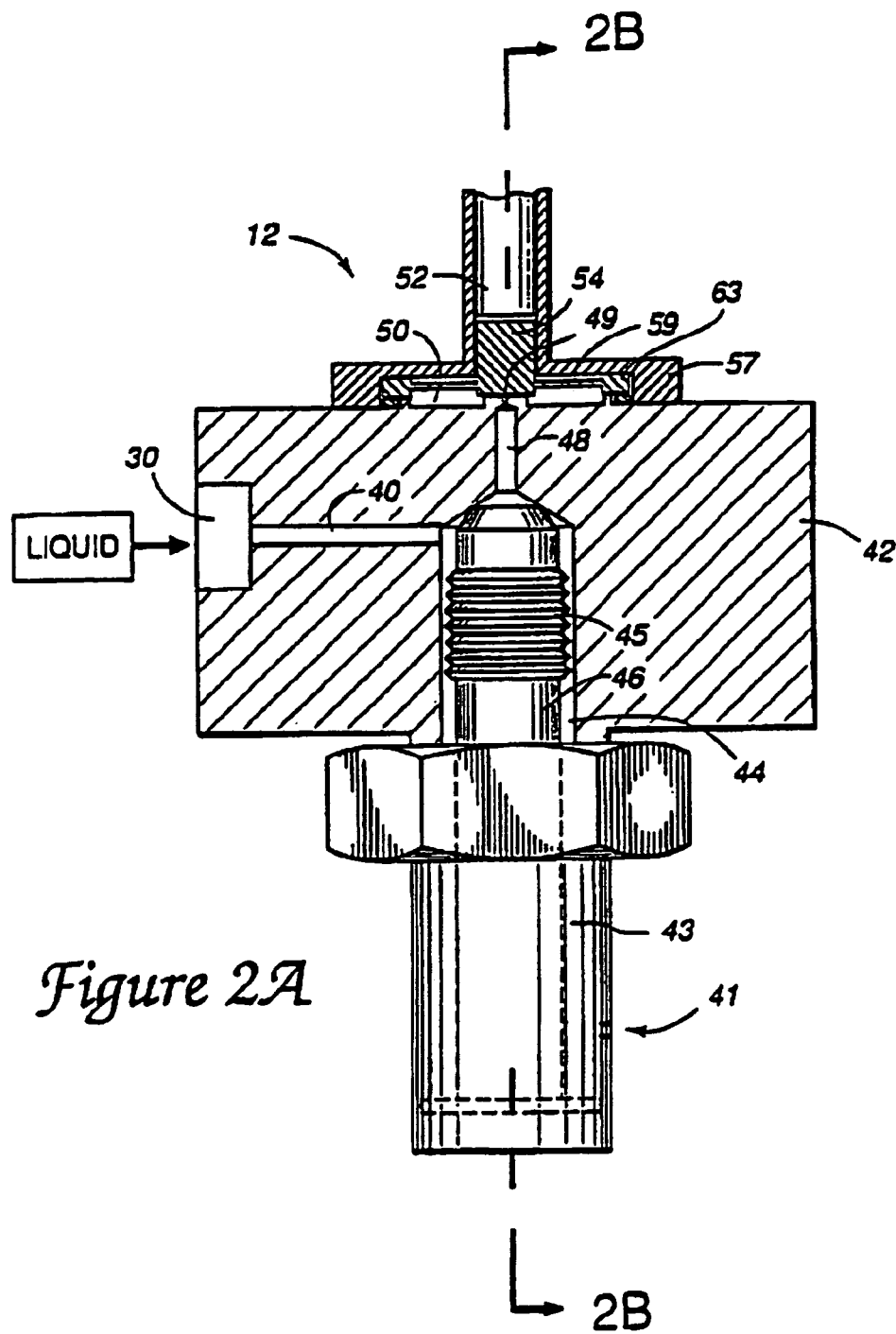
FIG. 2A is a cross-sectional view of the vaporizer 12 of FIG. 1.

The drawings are not completely to scale in that the smaller passageways are exaggerated in diameter to make then visible on the drawings.

DESCRIPTION OF THE PREFERRED EMBODIMENT(S)

Turning now to the drawings, more particularly to FIG. 1, there is shown a liquid delivery system 10 which uses a specially designed vaporizer 12 for both liquid flow control and vaporization at a single stage. Liquid flow rate is controlled by a closed loop system between a liquid flow monitor 14 and the vaporizer. In the system 10, a liquid reactant 11, such as TEOS, trimethyl borate, tetraethyl borate, tetraethyl phosphate, tetraethyl phosphite, tetrakis (dimethylamino)titanium diethyl analog, water or the like is delivered from a liquid bulk delivery tank 16 to a CVD process chamber 18 of a conventional thermal or plasma-enhanced type. For example, such a chamber 18 is described in the following commonly owned issued U.S. Patents: U.S. Pat. No. 5,000,113, issued Mar. 19, 1991 to Adamik et al.; U.S. Pat. No. 4,668,365, issued May 26, 1987 to Foster et al.; U.S. Pat. No. 4,579,080, issued Apr. 1, 1986 to Benzing et al.; U.S. Pat. No. 4,496,609, issued Jan. 29, 1985 to Benzing et al. and U.S. Pat. No. 4,232,063, issued Nov. 4, 1980 to East et al., the disclosures of which are incorporated by reference herein.

The liquid bulk delivery tank 16 has a dip tube 20 extending into the tank 16 and a source 24 providing a pressurized gas such as helium to "head" space 26 at the top of tank 16, above the liquid reactant 11, for driving the liquid from the tank. The liquid flow monitor 14 is connected between the liquid bulk delivery tank 16 and liquid inlet 30 of the vaporizer 12. A controlled amount of liquid is injected by the vaporizer 12, which converts the liquid to vapor by expansion and transports the vapor to the process chamber 18 by means of a carrier gas, such as helium, nitrogen or argon. A control signal from the liquid flow monitor 14 is fed back via control electronics 32 to the liquid flow control input of vaporizer 12. A gas tank 34 containing the carrier gas is connected to gas inlet 36 of the vaporizer 12 through a mass flow controller 38 which regulates the gas flow rate.

In many applications, liquid 11 may be toxic and/or caustic. To facilitate servicing of the system 10 and its component valves and other elements, a purge line 39 is connected between the gas tank 34 and the liquid flow monitor to allow the operator to purge system 10 of the reactant liquid 11 and its vapor before servicing. To further reduce the amount of reactant in the system, a vacuum line 41 is used in conjunction with purge line 39 to evacuate liquid and vapor from the system. (Vacuum line 41 is coupled to the vacuum system of the CVD process chamber.)

Remotely controllable (e.g., pneumatic) valves 13 and manual valves 15 are inserted on each line. These valves are opened and closed to enable normal operation and purge and evacuation operations. To enhance safety and fault-tolerance, each line having a remotely controlled valve 13 also has a manual valve 15 which can be closed manually if the remotely controlled valve fails.

Details of the vaporizer 12 are shown in FIGS. 2A–2D. Referring to FIG. 2A, liquid inlet port 30 is connected by passage 40 through valve body 42 to shut off valve bore 44, which contains a piston 46. When the shut off valve is closed, piston 46 seats against the inner face of valve bore 44 (as shown in FIG. 2A), preventing liquid flow. Any suitable actuating means can be used to move valve piston 46 along bore 44 into and out of this seated position. In one embodiment, a bellows spring 45 generates pressure tending to seat piston 46 against the valve bore 44 and close the shut off valve. The shut off valve is opened by driving compressed air into a cavity 43 via opening 41, generating force on piston 46 and moving it out of bore 44, allowing liquid to flow. Other types of valves can be used for shut off valve, e.g., a diaphragm valve.

Passageway or channel 48 within valve body 42 connects the shut off valve bore 44 to a control valve bore or cavity 50. The control valve bore do contains a piezo valve having a piezoelectric member 52 and a diaphragm 54 positioned proximate to opening 49 at the end of passage 48. Electrical excitation of the piezoelectric member 52 causes the diaphragm 54 to move closer to or further from the end of passage 48, thereby controlling liquid flow.

The piezo valve may be implemented with a commercially available piezo-electric valve, such as model IV1000 or IV2000 type, obtainable from STEC, Kyoto, Japan. In one embodiment, the valve typically operates at a flow rate of 0.3–0.6 grams/minute, in which case the gap between the diaphragm 54 and opening 49 is approximately 10 µm. (Excessive gap height can cause undesirable turbulence in the control valve bore 50.) In this embodiment, the piezoelectric valve can be selected to provide a 0–30 µm gap adjustment range, e.g., at an input voltage of 5 Volts, the gap is 10–15 µm, and at an input voltage of 15 Volts, the gap is 30 µm. Thus, the piezoelectric valve not only provides liquid flow control, but can also operate temporarily to fully shut off liquid flow.

A typical piezoelectric valve must be supplied with electrical power, e.g., ±15 Volt supplies, to operate properly; typically the valve will relax to a fully open state when electrical power is removed. Thus, to protect against electrical failure, it is prudent to connect a piezoelectric valve in series with a positive shut off valve such as that provided by piston 46. Alternatively, a different proportional control valve could be substituted for the piezo valve, possibly providing both flow control and positive shut-off.

Figure 2B:
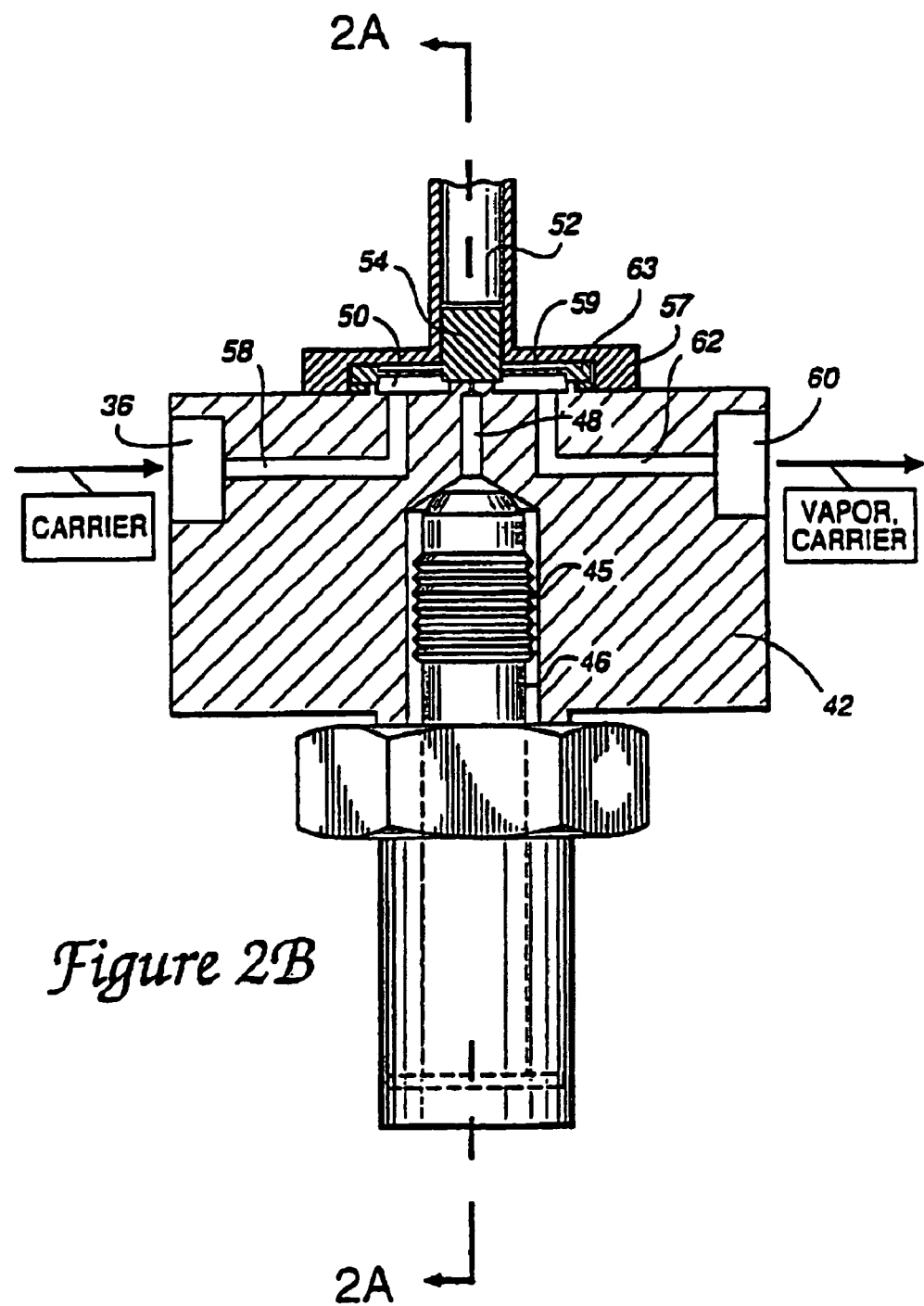
FIG. 2B is a second cross-section view of vaporizer 12.

Referring to FIG. 2B, gas inlet port 36 is connected by passage 58 through valve body 42 to control valve bore 50. Outlet port 60 is connected by passage 62 through valve body 42 to the control valve bore 50. Housing 57 retains the diaphragm 54 in proximity to the valve body 42. Diaphragm 54 has a cylindrical center piston 61 (FIG. 2D) which is positioned parallel to, and an adjustable close spacing from, the surface of valve seat 53. Diaphragm 54 also has thick annular edge 63 which rests on a circular lip 56 formed in the valve body 42. Diaphragm 54 is manufactured of stainless steel or a similarly flexible metal. Movable "spider"

portion 59 of diaphragm 54 comprises a thin (e.g., 40–50 mil), elastic, annular sheet or membrane connecting the thick annular edge 63 and the cylindrical center piston 61. Annular O-ring seal 55 couples to the annular edge of diaphragm 54 and thereby contains the vapor/carrier mixture within valve bore 50.

Figure 2C:
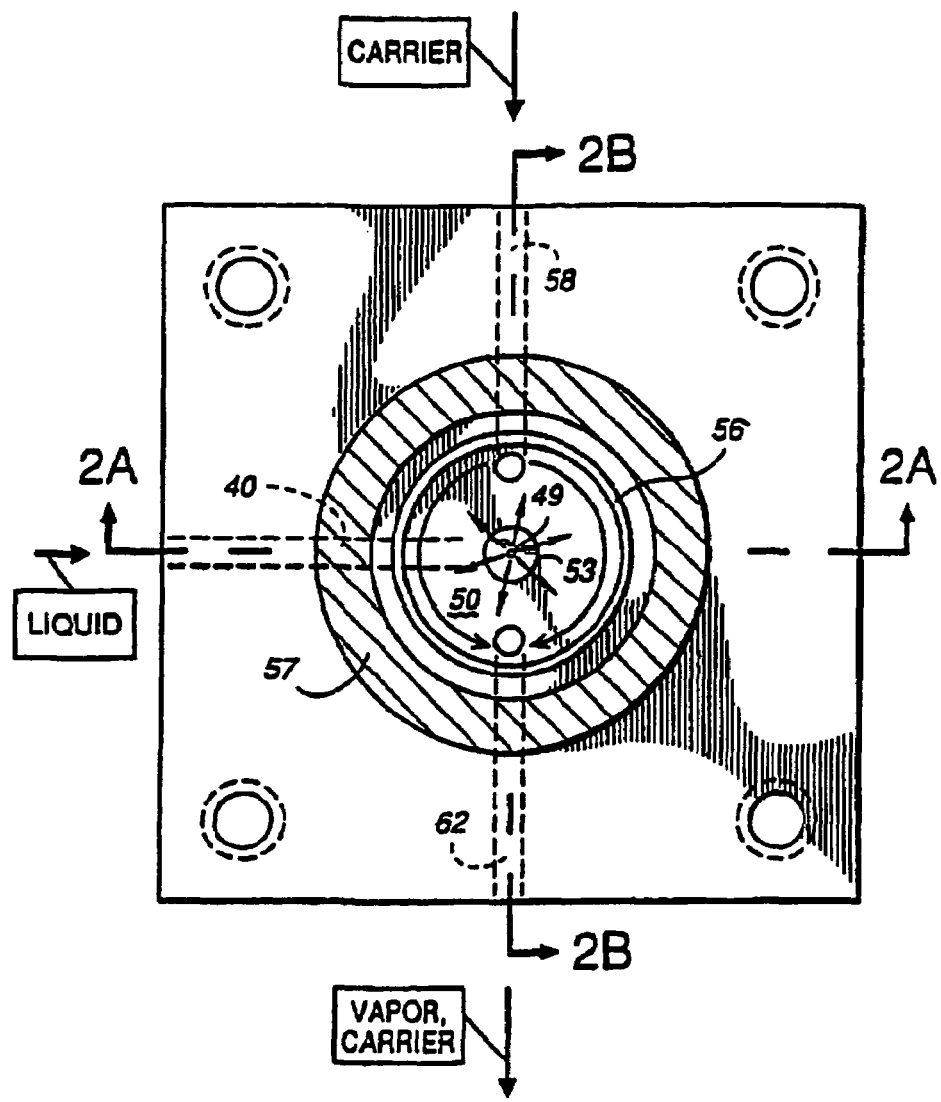
FIG. 2C is a plan view of vaporizer 12.

FIG. 2C shows opening 49 disposed between passages 58 and 62 within control valve bore 50. Opening 49 is large enough in diameter to prevent constriction of the liquid flow into the valve bore 50 (if opening 49 is too small the flow rate can no longer be adjusted by the piezo valve). The radial arrows in FIG. 2C indicate the direction of flow of the liquid into the valve bore 50 from the orifice 49. The circular arrows in FIG. 2C indicate the direction of flow of the carrier gas out of passage 58 circumferentially around the annular valve bore 50 (where the carrier gas mixes with vaporized liquid), and into passage 62.

FIG. 2C also illustrates: circular seat 53 which engages the face of diaphragm 54 (as discussed below with reference to FIG. 2D); circular lip 56 which engages the thick annular edge 63 of diaphragm 54; and the circular center edge of housing 57.

Figure 2D:
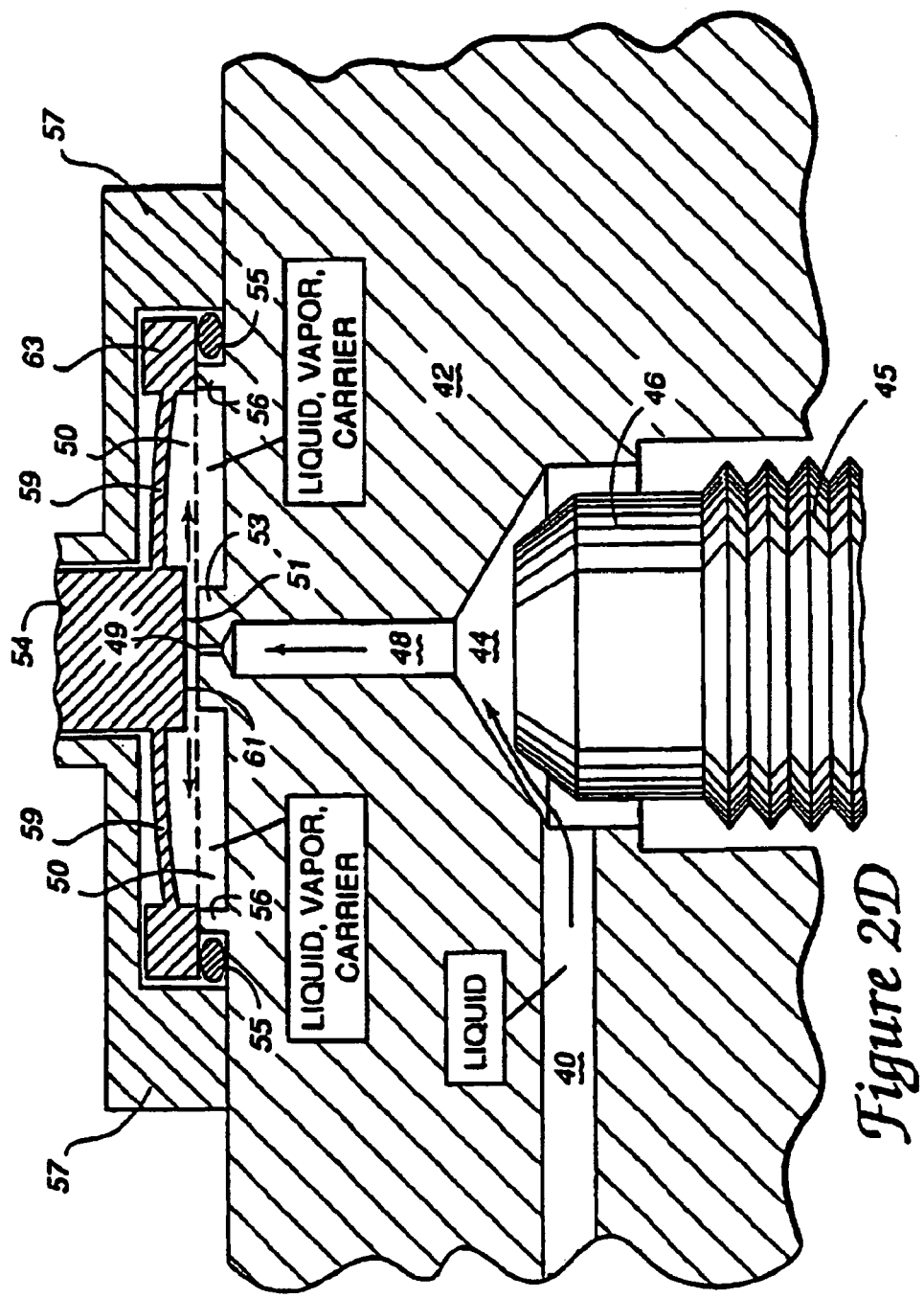
FIG. 2D is a detail view of the diaphragm of vaporizer 12.

Referring to FIG. 2D, during operation, liquid reactant 11 such as TEOS is pressurized by source 24 (FIG. 1) at, e.g., from about 2 to about 30 pounds per square inch (psi). When the shut off valve is open (i.e., piston 46 is drawn out of bore 44, as shown), the liquid enters liquid inlet port 30, flows via liquid inlet passages 40 and 48, and is injected out of the opening 49 into a vaporizing area 51 formed in the control valve bore 50 between the diaphragm 54 and seat 53 which rises out of valve body 42 and which contains opening 49. It has been found that turbulent vaporization, which can be detected by oscillating flow measured by flow meter 14, may occur if the diameter of the seat 53 is too large. In one embodiment, the diameter of the seat is approximately 0.5 cm. It has also been found that the more efficient vaporization can be achieved if the diameter of the face of the diaphragm 54 coupled to the seat 53 is larger than the diameter of the seat itself. In one embodiment, the proportion of these two diameters is as illustrated in FIG. 2D. The amount of liquid 11 injected into the vaporizing area 51 is controlled by position of the diaphragm 54 relative to the opening 49; which is in turn controlled by the electrical excitation of the piezoelectric member 52.

When exiting passage 48, liquid 11 sees a radial pressure drop within the vaporizing area 51 (the gradient of this pressure drop is indicated by arrows in FIG. 2C), and vaporizes by expansion. (A pressure drop gradient of this kind has been found to be more effective in rapidly and uniformly vaporizing liquid than a step pressure drop of the kind produced, e.g., by an atomizer.) After exiting vaporizing area 51, the vaporized reactant liquid mixes with carrier gas flowing from inlet passage 58 to outlet passage 62 and is transported out of the vaporizer to the CVD process chamber (FIG. 1). To prevent the vaporized reactant liquid, which has been cooled due to expansion, from condensing on the walls of cavity 50, the vaporizer is maintained at an elevated temperature by a surrounding heating jacket (not shown).

It will be noted in FIG. 3 that pressure from housing 57 downwards on the annular edge 63 of diaphragm 54 causes the center piston 61 of diaphragm 54 to bow upwards away from the surface of seat 53. Thus, the valve relaxes to an open position when no electrical excitation is applied to piezoelectric member 52 (FIG. 2A, 2B).

It will also be noted that in the embodiment illustrated in FIG. 2D, the surface of seat 53 is coplanar with the upper surface of lip 56. Thus, the line extending across cavity 50, which represents the upper surface of lip 56, is exactly collinear with the line representing the upper surface of seat 53.

Details of the control electronics 32 of FIG. 1 are shown in FIG. 3. Feedback control is used to control the piezo valve because the voltage-to-opening transfer function of the piezo valve can be difficult to control because it is non-linear, has hysteresis, and drifts with changes in temperature, pressure, and liquid flow rates. The control electronics 32 include a proportional-integral-derivative (PID) control circuit 72 which generates an output on line 80 which is a function of: the difference between the signals on lines 76 and 78; the integral of this difference; and the derivative of this difference. The input-output relationship of the PID circuit is chosen to maximize the stability and tracking of the circuit and minimize response time. Preferably, an auto-tune or adaptive filtered PID circuit is used so that the control function is continuously optimized to the system response. Any commercially available adaptive PID circuit, for example the PID sold by Watlow Controls under part no. 965A, can be suitably used in the FIG. 3 application.

The inputs to the PID 72 are a 0 to 5 volt flow output signal supplied by the liquid flow monitor on line 76, and a 0 to 5 volt set point signal on line 78. The output of PID 72 is a 0 to 5 volt position input signal which is supplied to the piezo valve on line 80. The PID 72 drives the position signal on line 80 so that the flow monitor output signal on line 76 is equal to the set point signal on line 78. If the liquid flow rate is below the desired level, the flow output signal on line 76 and the set point signal on line 78 will differ, and the PID 72 will drive the vaporizer 12 to increase the liquid flow by opening the piezoelectric valve. If the liquid flow rate is above the desired level, PID 72 will drive the vaporizer 12 to decrease liquid flow by closing the piezoelectric valve.

System 10 is simple, easily maintainable, low cost and provides improved process control. By using the vaporizer 12 of the present invention, both the liquid flow control and the vaporization occur at a single stage. As a result, vapor flow rate, repeatability, and responsiveness are improved, and independent control of liquid and carrier gas flow rates are achievable. Hence, film properties can be independently controlled.

It should be apparent to those skilled in the art that various changes in form and details of the invention as shown and described may be made. For example, the liquid mass flow can be controlled separately from the liquid vaporization. To accomplish this objective, the liquid flow monitor 14 of FIG. 1 may be replaced with a liquid mass flow controller having a low pressure differential, and an additional high-temperature monitor may be inserted in line 47. The control electronics may then contain separate sections: a first section controlling the liquid mass flow to a desired value by driving the input of the liquid mass flow controller; and a second section controlling the vaporization at the piezo valve of vaporizer 12 in response to measurements generated by the high-temperature monitor.

It is intended that these and any other alternative embodiments be included within the spirit and scope of the claims appended hereto.

What is claimed is:

1. A chemical vapor deposition system using a liquid reactant and a carrier gas, comprising:

a chemical vapor deposition chamber having a gas inlet port, and a liquid reactant vaporizer having an outlet port connected to said chamber inlet port, said vaporizer comprising:

a valve body having a first aperture, a second aperture, and a third aperture;

a valve seat;

a gas inlet port for receiving said carrier gas, said gas inlet port connected to said first aperture through a first fluid channel;

a liquid inlet port for receiving the liquid reactant, said liquid inlet port connected to said second aperture through a second fluid channel;

a valve mechanism including a valve element disposed adjacent to said valve seat and forming a valve region, said valve seat being continuously adjustable by said valve mechanism over a continuous range of settings between and including a fully closed position and a fully open position so as to variably control the flow rate of the fluid; and an outlet port connected to said third aperture through a third fluid channel.

2. A chemical vapor deposition system using a liquid reactant and a carrier gas, comprising:

a chemical vapor deposition chamber having a gas inlet port, and a liquid reactant vaporizer having an outlet port connected to said chamber inlet port, said vaporizer comprising:

a valve body having a first aperture, a second aperture, and a third aperture;

a valve seat;

a gas inlet port for receiving said carrier gas, said gas inlet port connected to said first aperture through a first fluid channel;

a liquid inlet port for receiving the liquid reactant, said liquid inlet port connected to said second aperture through a second fluid channel;

a valve mechanism including a valve element disposed adjacent to said valve seat and forming a valve region, said valve seat being continuously adjustable by said valve mechanism over a continuous range of settings between and including a fully closed position and a fully open position so as to variably control the flow rate of the fluid; and the outlet port is connected to said third aperture through a third fluid channel, the valve body defining a first volume in adjustable, fluid communication with a second volume through the valve seat wherein during normal operation the pressure in the first volume is different than the pressure in the second volume.

3. A method for vaporizing a liquid and mixing the vaporized liquid with a carrier gas, the method comprising:

a) providing a vaporizer having:

a valve body having a first aperture, a second aperture and a third aperture;

a valve seat through which fluid flows;

a gas inlet port for receiving said carrier gas, said gas inlet port connected to said first aperture through a first fluid channel;

a liquid inlet port for receiving the liquid, said liquid inlet port connected to said second aperture through a second fluid channel;

a valve mechanism including a valve element disposed adjacent to and opposite said valve seat, said valve element being continuously adjustable by said valve mechanism over a continuous range of settings between and including a fully closed position and a fully open position; and an outlet port connected to said third aperture through a third fluid channel, the valve body defining a first volume in adjustable, fluid communication with a second volume through the valve seat wherein during normal operation the pressure in the first volume is different than the pressure in the second volume;

b) providing sources of liquid and carrier gas; and c) vaporizing liquid in the valve seat by operating the valve and sources such that there is a change in pressure from the liquid inlet to the vapor outlet.

* * * * *